(12) United States Patent
Lin et al.

(10) Patent No.: US 7,345,341 B2
(45) Date of Patent: Mar. 18, 2008

(54) HIGH VOLTAGE SEMICONDUCTOR DEVICES AND METHODS FOR FABRICATING THE SAME

(75) Inventors: Yi-Chun Lin, Hsinchu (TW); Kuo-Ming Wu, Hsinchu (TW); Reuy-Hsin Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 11/351,154

(22) Filed: Feb. 9, 2006

(65) Prior Publication Data

US 2007/0181941 A1 Aug. 9, 2007

(51) Int. Cl.
*H01L 29/94* (2006.01)
(52) U.S. Cl. ............... 257/335; 257/336; 257/342; 257/346; 257/401; 257/409; 257/492; 257/493; 257/E29.012; 257/E29.256; 257/E29.261; 257/E21.417; 257/E21.427
(58) Field of Classification Search ............... 257/335
See application file for complete search history.

(56) References Cited

U.S. PATENT DOCUMENTS

| | | | |
|---|---|---|---|
| 6,277,675 B1 | 8/2001 | Tung | 438/138 |
| 6,424,005 B1 * | 7/2002 | Tsai et al. | 257/335 |
| 6,441,431 B1 * | 8/2002 | Efland et al. | 257/335 |
| 6,455,893 B1 | 9/2002 | Gehrmann et al. | 257/339 |
| 6,635,925 B1 * | 10/2003 | Taniguchi et al. | 257/335 |
| 6,707,112 B2 * | 3/2004 | Kachelmeier | 257/368 |
| 6,894,350 B2 | 5/2005 | Shimizu et al. | 257/343 |
| 6,900,101 B2 | 5/2005 | Lin | 438/276 |
| 6,902,258 B2 | 6/2005 | Chen et al. | 347/59 |
| 7,245,243 B2 * | 7/2007 | Takimoto et al. | 341/112 |
| 2002/0072159 A1 * | 6/2002 | Nishibe et al. | 438/179 |

* cited by examiner

*Primary Examiner*—Sue A. Purvis
*Assistant Examiner*—Eduardo A. Rodela
(74) *Attorney, Agent, or Firm*—Thomas, Kayden, Horstemeyer & Risley

(57) ABSTRACT

High voltage semiconductor devices and methods for fabricating the same are provided. An exemplary embodiment of a semiconductor device capable of high-voltage operation, comprising a substrate comprising a first well formed therein. A gate stack is formed overlying the substrate, comprising a gate dielectric layer and a gate electrode formed thereon. A channel well and a second well are formed in portions of the first well. A source region is formed in a portion of the channel well. A drain region is formed in a portion of the second well, wherein the gate dielectric layer comprises a relatively thinner portion at one end of the gate stack adjacent to the source region and a relatively thicker portion at one end of the gate stack adjacent to and directly contacts the drain region.

9 Claims, 4 Drawing Sheets

HIGH VOLTAGE SEMICONDUCTOR DEVICES AND METHODS FOR FABRICATING THE SAME

BACKGROUND OF THE INVENTION

1. Field of the Invention

The present invention relates to integrated circuit fabrication, and in particular to semiconductor devices capable of sustaining high-voltage and methods for fabricating the same

2. Description of the Related Art

In current integrated circuit processing, controllers, memories, operation of low-voltage circuits and high-voltage (HV) power devices are largely integrated into a single chip, thus achieving a single-chip system. To handle high voltage and current, DMOS (double-diffused metal oxide semiconductor) transistors are conventionally used for the power devices, which can operate with low on-resistance while sustaining high voltage.

LDMOS (lateral double-diffused metal oxide semiconductor) transistors in particular have a simple structure suitable for incorporation into the VLSI logic circuits, however, they have been considered inferior to VDMOS (vertically double-diffused metal oxide semiconductor) transistors as they have high on-resistance. Recently, RESURF (reduced surface field) LDMOS devices, capable of providing low on-resistance, have been introduced and are increasingly used in power devices.

FIG. 1 illustrates a portion of a conventional LDMOS transistor, including a substrate 100, a well region 102, a first oxide region 104, a second oxide region 106, a gate oxide layer 108, a gate electrode 110, a channel well region 112, a source region 114, and a drain region 116.

As shown in FIG. 1, the second oxide region 106 is formed over the substrate 100 and the gate electrode 110 partially covers a portion of the second oxide region 106, therefore enabling high-voltage (HV) operation of the LDMOS transistor. Nevertheless, one problem of the conventional LDMOS transistor of FIG. 1 is that the second oxide region 106 interrupts current flowing from the source region 114 to the drain region 116. This eventually increases on-resistance of the LDMOS transistor.

Moreover, a semiconductor device having the conventional LDMOS transistor of FIG. 1 needs a large cell pitch and is therefore disadvantageous when the size of the semiconductor device is reduced.

BRIEF SUMMARY OF THE INVENTION

A detailed description is given in the following embodiments with reference to the accompanying drawings.

High voltage semiconductor devices and methods for fabricating the same are provided. An exemplary embodiment of a semiconductor device capable of high-voltage operation, comprising a substrate comprising a first well formed therein. A gate stack is formed overlying the substrate, wherein the gate stack comprises a gate dielectric layer and a gate electrode formed thereon. A channel well and a second well are formed in portions of the first well, located on opposite sides of the gate stack. A source region is formed in a portion of the channel well. A drain region is formed in a portion of the second well, wherein the first well and the second well is formed with a conductivity type opposite to that of the substrate, the channel well is formed with a conductivity type the same as that of the substrate, wherein the gate dielectric layer comprises a relatively thinner portion at one end of the gate stack adjacent to the source region and a relatively thicker portion at one end of the gate stack adjacent to and directly contacts the drain region.

Another embodiment of a method for fabricating a semiconductor device capable of high-voltage operation, comprises providing a substrate formed with a first well therein. A channel well is formed in a first portion of the first well. A patterned composite layer is formed over a portion of the-substrate, covering the channel well and exposing a portion of the first well, wherein the patterned composite layer comprises a dielectric layer, a conductive layer and a mask layer sequentially stacked over the substrate. A second well is formed in a second portion of the exposed first well. An oxide layer is simultaneously formed over the conductive layer and the surface of the substrate exposed by the conductive layer, and an oxide portion is formed in a portion of the conductive layer adjacent to the second well region after removal the mask layer of the patterned the composite layer. The oxide layer formed over the conductive layer and the exposed surface of the substrate are removed, leaving the dielectric layer integrated with the oxide portion protruding at the end of the conductive layer adjacent to the second well as a gate dielectric layer. The conductive layer and the gate dielectric layer are next patterned and a gate stack is thus formed overlying the substrate exposing a portion of the channel well region and a portion of the second well region. A source region is next formed in a portion of the exposed channel region and a drain region is formed in a portion of the exposed second well region, wherein the first well, the second well, the source region and the drain region are formed with a conductivity type opposite to that of the substrate, the channel well is formed with a conductivity type the same as that of the substrate, and the gate dielectric layer directly contacts the drain region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-6 illustrate an exemplary embodiment of a method for fabricating a semiconductor device including an LDMOS with reduced size and improved electrical performance.

Figure 1:
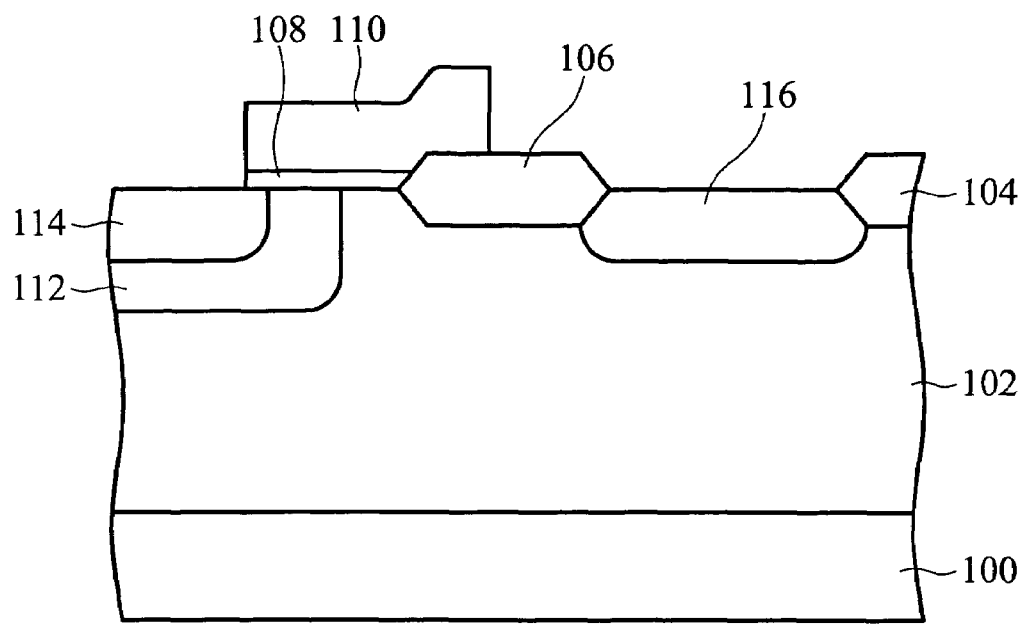
FIG. 1 is a schematic cross-section illustrating a semiconductor device including a LDMOS transistor of the related art.
Figure 2:
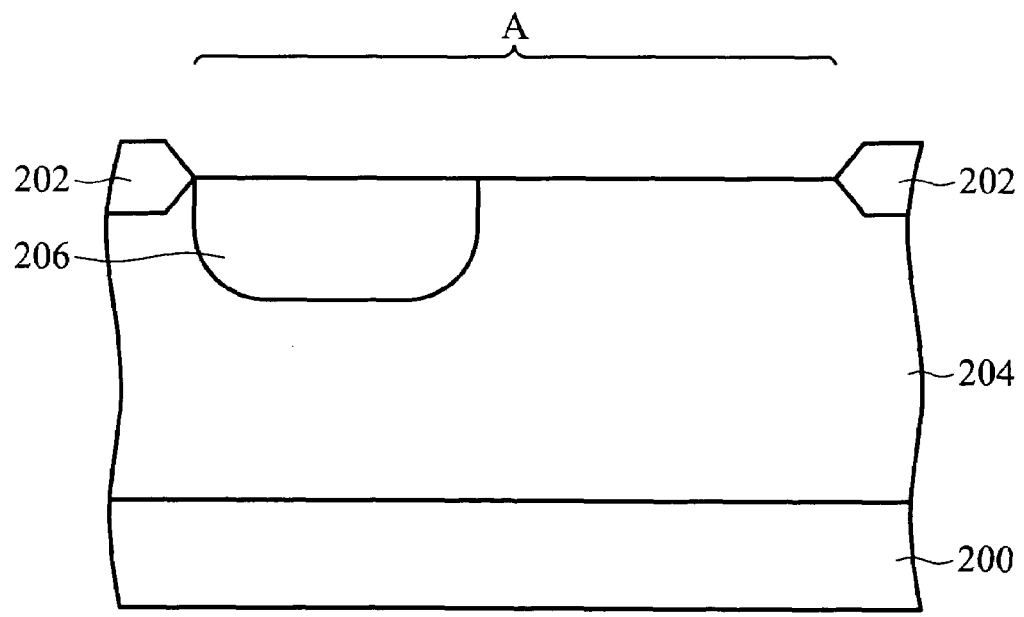
FIGS. 2-6 are schematic cross-sections illustrating a method for forming a semiconductor device including an LDMOS transistor according to an embodiment of the invention.

In FIG. 2, a semiconductor substrate 200 is provided with two isolation structures 202 thereon, defining an active area A. The semiconductor substrate 200 can be, for example a silicon on insulator (SOI) substrate, a bulk silicon substrate or silicon epitaxy layer formed over a substrate. The semiconductor substrate 200 can be formed with a first conductive type such as P-type or N-type conductivity. The isolation structures 202 in FIG. 1 are illustrated as field oxide (FOX) regions here but are not limited thereto, other isolation structures such as conventional shallow trench isolation (STI) structures can be also adopted. Next, a first well region 204 is formed in the substrate 200, having a conductive type opposite to that of the substrate 200. The doping concentration of the first well region 204 can be, for example, between 1E12 atoms/cm$^2$ and 1E13 atoms/cm$^2$. Formation of the first well region 204 can be achieved by the well known well implantation method using a patterned implant mask (not shown). A channel well region 206 is next formed in a portion of the first well region 204, having a conductive type the same as that of the substrate 200. The doping concentration of the channel well region 206 can be, for example, between 1E13 atoms/cm$^2$ and 1E14 atoms/cm$^2$. Formation of the first well region 204 and the channel well region 206 can be achieved by conventional well implantation techniques using a patterned implant mask (not shown) and well known P-type or N-type dopants.

Figure 3:
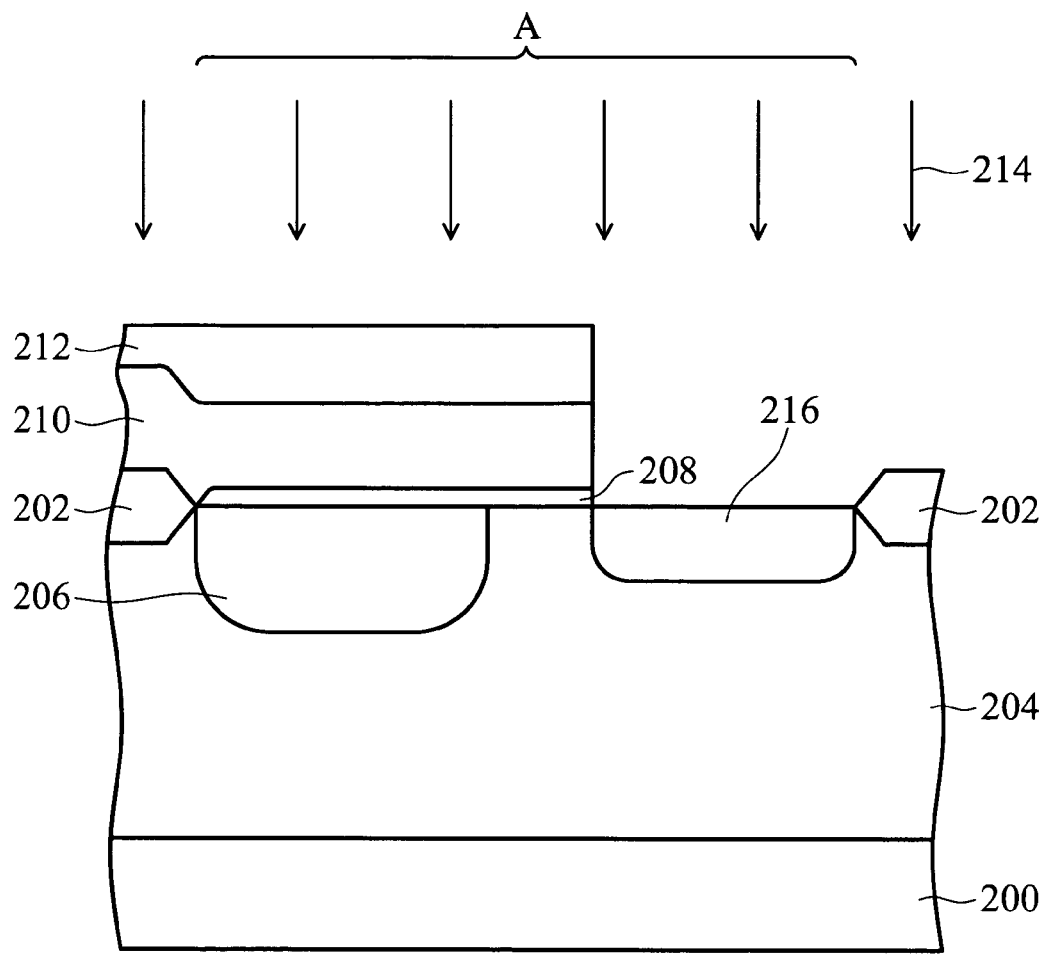

In FIG. 3, a dielectric layer 208 is next formed on the substrate 200 within the active area A. A conductive layer 210 is sequentially formed over the substrate 200, covering the dielectric layer 208 and the isolation structures 202. Next, a patterned mask layer 212 is formed over the conductive layer 210 and exposes a portion of the conductive layer 210 in the active area A. An etching (not shown) is next performed to remove the conductive layer 210 and the dielectric layer 208 exposed by the patterned mask layer 212, thereby exposing a portion of the substrate 200 in the active area A. Next, an ion implantation 214 is performed to implant dopants of the same conductive type as that of the first well region 204, forming a second well region 216 in the first well region 204. The doping concentration of the ion implantation 214 is about, for example, 1E12 atoms/cm$^2$ and 1E14 atoms/cm$^2$. Doping concentration in the formed second well region 216 can be, for example, 1E12 atoms/cm$^2$ and 1E14 atoms/cm$^2$ and is larger than that of the first well region 204, thereby providing an additional resistant for the finally formed LDMOS breakdown and on-resistance trade off during HV operation. The dielectric layer 208 can be a silicon oxide layer formed by, for example, thermal oxidation and the conductive layer 210 may be silicon-containing conductive layer, for example a polysilicon layer. The patterned mask layer 212 may be, for example, a resist layer.

Figure 4:
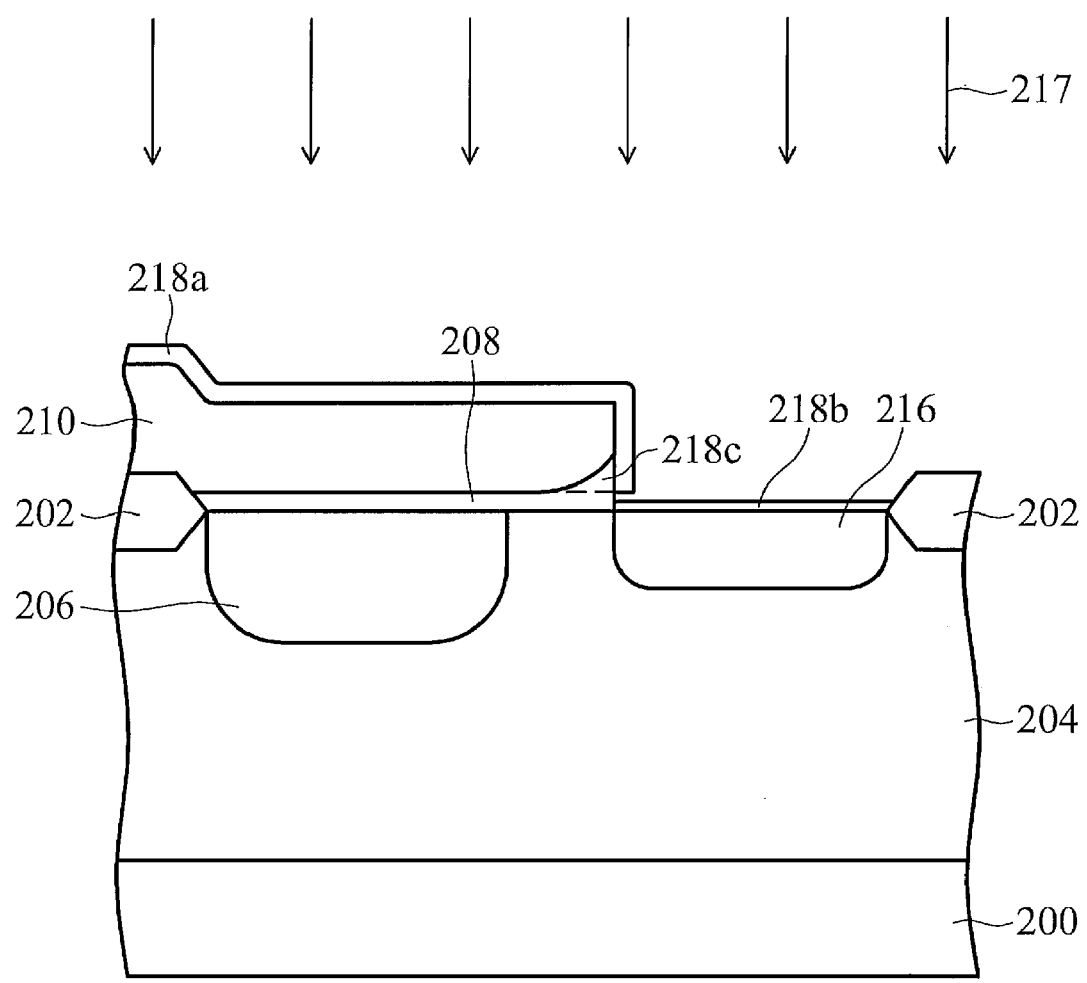

In FIG. 4, the patterned mask layer 212 is removed and an annealing process 217 is sequentially performed under an oxygen-containing atmosphere and a temperature between about 800-1000° C. Therefore, silicon oxide layers 218a and 218b respectively forms over exposed portions of the conductive layer 210 and the surface of the substrate 200 over the second well region 216. Since the conductive layer 210 is formed by silicon-containing conductive layer such as polysilicon and the substrate is formed of silicon, growth rates of the silicon oxide layers 218a and 218b are therefore different. Typically, the growth rate of the silicon oxide layer 218a formed over the patterned conductive layer 210 is greater than that of the silicon oxide layer 218b formed over the substrate. Thus, the silicon oxide layer 218a is formed at a thickness greater than that of the silicon oxide layer 218b after the thermal annealing process 216. Moreover, oxidation also occurs at an interface between the patterned conductive layer 210 and the patterned dielectric layer 208 at a side wall adjacent to the second well region 216 during the annealing process 217 and further protrudes into the patterned conductive layer 210 along the interface, thus forming an oxide portion 218c in an end adjacent to the second well region 216.

Figure 5:
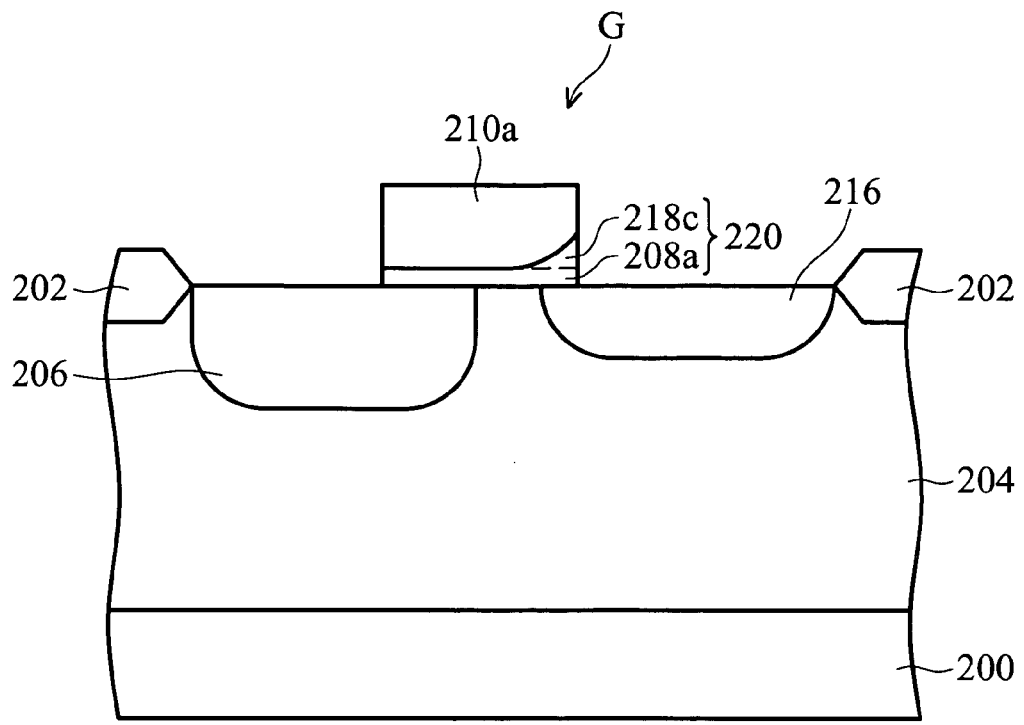

In FIG. 5, an etching (not shown) is next performed to remove both the silicon oxide layers 218a and 218b, thereby leaving the patterned conductive layer 210 and the patterned dielectric layer 208 over the substrate 200, wherein the patterned conductive layer 210 is formed with oxide portion 218c therein at the end adjacent to the second well region 216. Next, a patterned mask layer (not shown) is formed over the substrate 200, exposing a portion of the patterned conductive layer 210 and the patterned dielectric layer 208 at the end adjacent to the channel well region 206 and a sequential etching is performed thereon, using the patterned mask layer as an etching mask, thereby forming a gate stack G over the substrate 200 after removal of the patterned mask layer.

As shown in FIG. 5, the gate stack G includes a gate electrode 210a and an underlying gate dielectric layer 220, wherein the gate dielectric layer 220 comprises a patterned dielectric layer 208a and a thermally formed oxide portion 218c which protrudes into the gate stack G at the end adjacent to the second well region 216, having a triangle-like shape but is not limited thereto.

Figure 6:
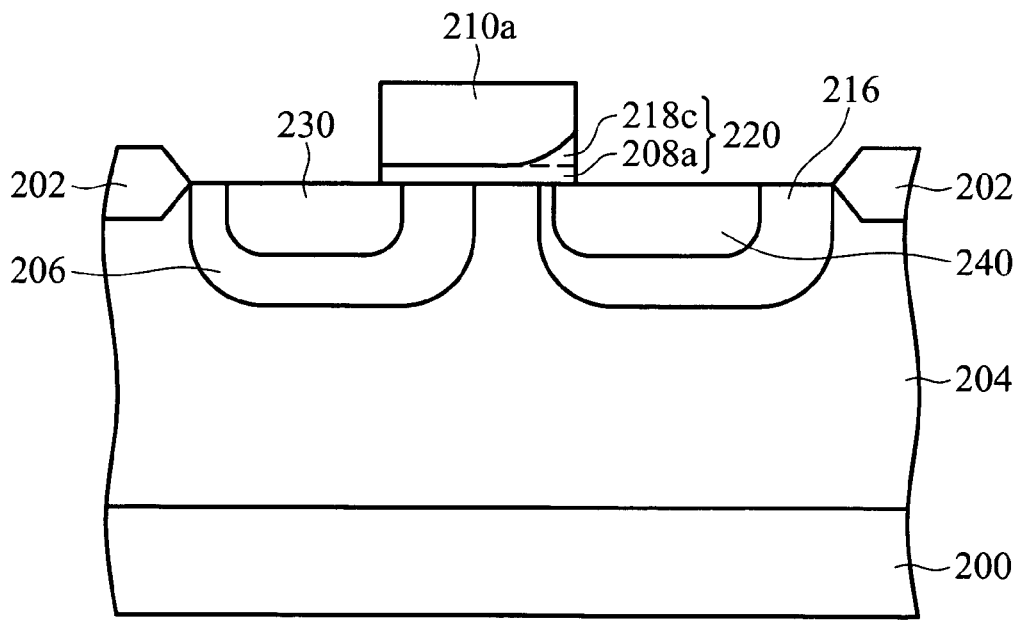

In FIG. 6, a source/drain implantation (not shown) is performed on the substrate 200 and the gate stack G under protection of properly formed mask patterns (not shown) formed over the substrate 200, thereby forming a source region 230 in the channel well region 206 and a drain region 240 in the second well region 216, each directly contacting the gate stack G. The source region 230 and the drain region 240 are formed with a conductive type the same as that of the first well region 204 and have a doping concentration of about 1E15 atoms/cm$^2$ and 7E15 atoms/cm$^2$.

Moreover, the gate dielectric layer 220 of the LDMOS transistor shown in FIG. 6 is now integrally formed with a relatively thicker portion protruding into the gate electrode 210a at the end of the gate stack G adjacent the drain region 240, thus providing the formed LDMOS transistor with HV operating capability, such as the capability to operate at 5 voltage or above. Typically, the other portion of the gate dielectric layer 220 is formed with a substantially uniform thickness of about 30-200 Å, extending from the source region 230 toward the drain region 240, and is relatively thinner than that of the above mentioned relatively thicker portion. The relatively thicker portion of the gate dielectric layer 220 is formed at a various thickness between 300-2000 Å and the thickness therefore increases progressively and continuously toward the drain region 240. Therefore, an LDMOS transistor with reduced size and on-resistance is obtained, since there is no additional bulk oxide layer (i.e. the second oxide region 106 in FIG. 1) formed over the substrate 200 and the gate stack G of the LDMOS transistor directly contacts the drain region 240.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device capable of high-voltage operation, comprising:

a substrate comprising a first well formed therein;

a gate stack overlying the substrate, wherein the gate stack comprises a gate dielectric layer that maintains a uniform thickness and a gate electrode formed thereon;

a channel well and a second well formed in portions of the first well, located on opposite sides of the gate stack;

a source region formed in a portion of the channel well;

a drain region formed in a portion of the second well; and an oxide portion formed in an end of the gate electrode layer and disposed on a portion of the gate dielectric layer adjacent to the drain region;

wherein the first well and the second well is formed with a conductivity type opposite to that of the substrate, the channel well is formed with a conductivity type the same as that of the substrate;

wherein a thickness of the oxide portion increases progressively to the end of the gate stack adjacent to the drain region.

2. The semiconductor device of claim 1, wherein the oxide portion has a triangular shape.

3. The semiconductor device of claim 1, wherein the combination of the oxide portion and the gate dielectric layer adjacent to the drain region is formed at variable thickness between 300~2000 Å.

4. The semiconductor device of claims 1, wherein the gate dielectric layer is formed at a uniform thickness between 30~200 Å.

5. The semiconductor device of claim 1, wherein a thickness of the oxide portion continuously increases toward the end of gate stack adjacent to drain region.

6. A high voltage semiconductor device, comprising:

a substrate comprising a first well formed therein;

a gate stack comprising a gate dielectric layer that maintains a uniform thickness formed overlying the substrate and a gate electrode formed on the gate dielectric layer;

a channel well and a second well formed in portions of the first well, located on opposite sides of the gate stack;

a source region formed in a portion of the channel well; and a drain region formed in a portion of the second well; and a thermally formed oxide portion protruding into an end of the gate electrode layer and disposed on a portion of the gate dielectric layer adjacent to the drain region;

wherein the first well and the second well is formed with a conductivity type opposite to that of the substrate, the channel well is formed with a conductivity type the same as that of the substrate;

wherein a thickness of the thermally formed oxide portion increases progressively to the end of the gate stack adjacent to the drain region.

7. The high voltage semiconductor device of claim 6, wherein the oxide portion has a triangular shape.

8. The high voltage semiconductor device of claim 6, wherein the combination of the oxide portion and the gate dielectric layer adjacent to the drain region is formed at variable thickness between 300~2000 Å.

9. The high voltage semiconductor device of claim 6, wherein the gate dielectric layer is formed at a uniform thickness between 30~200 Å.

* * * * *